United States Patent
Moon et al.

(10) Patent No.: US 9,304,854 B2
(45) Date of Patent: Apr. 5, 2016

(54) SEMICONDUCTOR DEVICE AND OPERATING METHOD THEREOF

(71) Applicant: SK hynix Inc., Icheon-si, Gyeonggi-do (KR)

(72) Inventors: Young-Suk Moon, Icheon-si (KR); Hyung-Dong Lee, Yongin Si (KR); Yong-Kee Kwon, Seoul (KR); Hong-Sik Kim, Seongnam-si (KR); Hyung-Gyun Yang, Icheon-si (KR); Joon-Woo Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 64 days.

(21) Appl. No.: 13/908,543

(22) Filed: Jun. 3, 2013

(65) Prior Publication Data

US 2013/0326267 A1 Dec. 5, 2013

(30) Foreign Application Priority Data

Jun. 4, 2012 (KR) .......................... 10-2012-060065

(51) Int. Cl.
| G06F 11/10 | (2006.01) |
| G06F 11/20 | (2006.01) |
| G06F 11/14 | (2006.01) |
| G06F 11/16 | (2006.01) |
| G11C 29/04 | (2006.01) |

(52) U.S. Cl.
CPC ........ *G06F 11/1024* (2013.01); *G06F 11/1048* (2013.01); *G06F 11/141* (2013.01); *G06F 11/1666* (2013.01); *G06F 11/2094* (2013.01); *G11C 2029/0411* (2013.01)

(58) Field of Classification Search
CPC .......................... G06F 11/1024; G06F 11/1048
USPC ..................................... 714/773, 723
See application file for complete search history.

(56) References Cited

U.S. PATENT DOCUMENTS

| 3,742,449 A * | 6/1973 | Blair .............................. 714/761 |
| 4,426,688 A * | 1/1984 | Moxley .......................... 365/200 |
| 4,479,214 A * | 10/1984 | Ryan .............................. 714/702 |
| 4,535,455 A * | 8/1985 | Peterson ........................ 714/6.2 |
| 4,654,847 A * | 3/1987 | Dutton ........................... 714/6.1 |
| 4,782,487 A * | 11/1988 | Smelser ......................... 714/723 |
| 5,325,364 A * | 6/1994 | Ouchi et al. .................... 714/5.1 |
| 5,473,753 A * | 12/1995 | Wells et al. ..................... 714/5.1 |
| 5,500,950 A * | 3/1996 | Becker et al. ................. 711/118 |
| 5,978,953 A * | 11/1999 | Olarig ............................ 714/768 |
| 5,991,911 A * | 11/1999 | Zook .............................. 714/758 |
| 5,996,105 A * | 11/1999 | Zook .............................. 714/755 |
| 6,052,815 A * | 4/2000 | Zook .............................. 714/758 |
| 6,092,231 A * | 7/2000 | Sze ................................ 714/758 |
| 6,119,248 A * | 9/2000 | Merkin .......................... 714/52 |
| 6,272,659 B1 * | 8/2001 | Zook .............................. 714/774 |
| 6,700,810 B1 * | 3/2004 | Ichiriu et al. ............... 365/49.18 |
| 6,701,480 B1 * | 3/2004 | Karpuszka et al. ........... 714/764 |

(Continued)

FOREIGN PATENT DOCUMENTS

KR     10-0402638 B1    10/2003

*Primary Examiner* — Joseph D Torres
(74) *Attorney, Agent, or Firm* — William Park & Associates Ltd.

(57) ABSTRACT

A semiconductor device includes a controller configured to receive a request for a first memory device, determine whether or not a multi-bit error has occurred at a requested address of the first memory device, and process the request on a second memory device instead of the first memory device, when the multi-bit error has occurred.

24 Claims, 10 Drawing Sheets

(56) References Cited

U.S. PATENT DOCUMENTS

| | | | |
|---|---|---|---|
| 6,707,693 B1 * | 3/2004 | Ichiriu | 365/49.17 |
| 6,751,771 B2 * | 6/2004 | Chuang et al. | 714/784 |
| 6,792,567 B2 * | 9/2004 | Laurent | 714/763 |
| 6,832,042 B1 * | 12/2004 | Shieh | 386/264 |
| 6,987,684 B1 * | 1/2006 | Branth et al. | 365/49.17 |
| 7,099,221 B2 * | 8/2006 | Klein | 365/222 |
| 7,134,069 B1 * | 11/2006 | Longwell et al. | 714/800 |
| 7,154,835 B2 * | 12/2006 | Iwata et al. | 369/59.25 |
| 7,193,876 B1 * | 3/2007 | Park et al. | 365/49.1 |
| 7,200,780 B2 * | 4/2007 | Kushida | 714/52 |
| 7,237,156 B1 * | 6/2007 | Srinivasan et al. | 714/719 |
| 7,257,763 B1 * | 8/2007 | Srinivasan et al. | 714/764 |
| 7,304,875 B1 * | 12/2007 | Lien et al. | 365/49.1 |
| 7,328,365 B2 * | 2/2008 | Karpuszka et al. | 714/6.2 |
| 7,353,438 B2 * | 4/2008 | Leung et al. | 714/720 |
| 7,428,687 B2 * | 9/2008 | Klein | 714/754 |
| 7,447,974 B2 * | 11/2008 | Klein | 714/754 |
| 7,493,534 B2 * | 2/2009 | Pomaranski et al. | 714/723 |
| 7,558,887 B2 * | 7/2009 | Gower et al. | 710/33 |
| 7,584,308 B2 * | 9/2009 | Gower et al. | 710/35 |
| 7,900,100 B2 * | 3/2011 | Gollub | 714/718 |
| 7,962,833 B2 * | 6/2011 | Juluri et al. | 714/769 |
| 8,082,482 B2 * | 12/2011 | Gower et al. | 714/763 |
| 8,086,913 B2 * | 12/2011 | Houg | 714/710 |
| 8,086,936 B2 * | 12/2011 | Gower et al. | 714/763 |
| 8,091,000 B2 * | 1/2012 | Chang et al. | 714/723 |
| 8,245,087 B2 * | 8/2012 | Abts et al. | 714/54 |
| 8,281,225 B2 * | 10/2012 | Kim et al. | 714/769 |
| 2002/0184592 A1 * | 12/2002 | Koga et al. | 714/763 |
| 2004/0128602 A1 * | 7/2004 | Lyons | 714/736 |
| 2004/0255224 A1 * | 12/2004 | Yabe | 714/763 |
| 2005/0050410 A1 * | 3/2005 | Pomaranski et al. | 714/723 |
| 2008/0201620 A1 * | 8/2008 | Gollub | 714/718 |
| 2009/0063729 A1 * | 3/2009 | Gower et al. | 710/35 |
| 2009/0063730 A1 * | 3/2009 | Gower et al. | 710/35 |
| 2009/0063731 A1 * | 3/2009 | Gower et al. | 710/35 |
| 2009/0063922 A1 * | 3/2009 | Gower et al. | 714/746 |
| 2009/0063923 A1 * | 3/2009 | Gower et al. | 714/746 |
| 2010/0269021 A1 * | 10/2010 | Gower et al. | 714/764 |

* cited by examiner

| fix | valid | address | data | counter |
|-----|-------|---------|------|---------|
| fix | valid | address | data | counter |
| fix | valid | address | data | counter |

· · ·

| fix | valid | address | data | counter |
|-----|-------|---------|------|---------|
| fix | valid | address | data | counter |
| fix | valid | address | data | counter |

SEMICONDUCTOR DEVICE AND OPERATING METHOD THEREOF

CROSS-REFERENCE TO RELATED APPLICATIONS

The present application claims priority of Korean Patent Application No. 10-2012-0060065, filed on Jun. 4, 2012, which is incorporated herein by reference in its entirety.

BACKGROUND

1. Field

Various embodiments of the present invention relate to a semiconductor device and an operating method thereof, and more particularly, to a semiconductor device capable of relieving a multi-bit error and an operating method thereof.

2. Description of the Related Art

Figure 1:
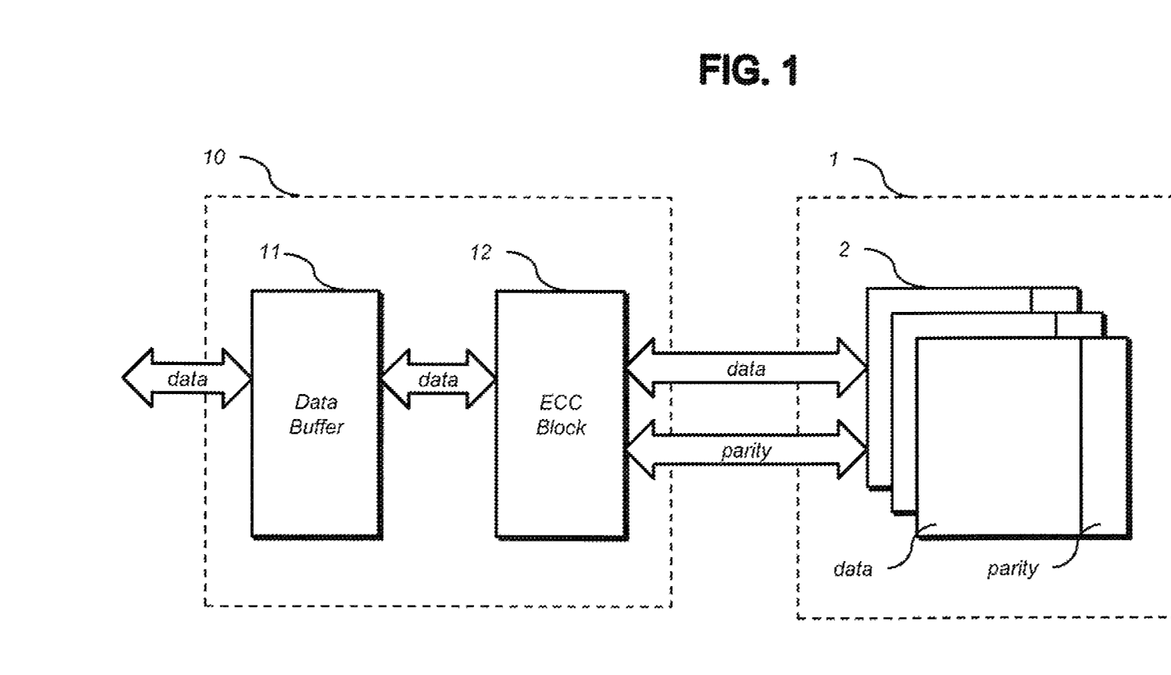
FIG. 1 is a block diagram of a conventional semiconductor device.

FIG. 1 is a block diagram of a conventional semiconductor device 10.

The conventional semiconductor device 10 includes a data buffer 11 configured to transmit and receive data according to an external request and an Error-Correcting Code (ECC) block 12 configured to sense and correct an error of data read from a semiconductor memory device 1.

The ECC block 12 generates parity information corresponding to data when a write request is made, and stores the data and the generated parity information in a semiconductor memory cell array 2.

When a read request is made, the ECC block 12 determines whether or not there is an error in data from the semiconductor memory cell array 2. For this operation, the ECC block 12 uses the parity information stored with the data.

The ECC block 12 included in the conventional semiconductor device 10 may sense and correct a single-bit error when the single-bit error occurs. However, when a two or more-bit error occurs, the ECC block 12 may sense the error, but cannot correct the sensed error.

SUMMARY

Various embodiments may be directed to a semiconductor device capable of guaranteeing the reliability of data by relieving a cell with a multi-bit error when the multi-bit error occurs in a memory device, and an operating method thereof.

Also, various embodiments may be directed to a semiconductor memory device capable of guaranteeing the reliability of data by managing a problem that a single-bit error occurring in a semiconductor memory device develops to a multi-bit error, and an operating method thereof.

Also, various embodiments may be directed to a semiconductor memory device capable of guaranteeing the reliability of data by relieving a storage space of a semiconductor memory device in which a multi-bit error occurred, using a separate memory device, and an operating method thereof.

Also, various embodiments may be directed to a semiconductor memory device capable of distinguishing a hard error and a soft error among single-bit errors occurring in a semiconductor memory device.

In an embodiment, a semiconductor device may include a controller configured to receive a request for a first memory device, determine whether or not a multi-bit error has occurred at a requested address of the first memory device, and process the request on a second memory device instead of the first memory device, when the multi-bit error has occurred.

The controller may process the request for the first memory device when a single-bit error has occurred at the requested address of the first memory device, and may register multi-bit error occurrence information corresponding to the request address when a multi-bit error exists in data outputted from the first memory device.

The controller may control the second memory device to perform the request for the first memory device on the second memory device, when the single-bit error has occurred.

When a single-bit error exists in data outputted from the first memory device as a result obtained by processing the request for the first memory device, the controller may control the second memory device to update single-bit error occurrence information corresponding to the requested address in the second memory device.

In an embodiment, a system may include a control device configured to configured to control a semiconductor memory device, wherein the control device may include: a memory device configured to store an address at which a multi-bit error has occurred in the semiconductor memory device and data corresponding to the address; and a controller configured to receive a request for the semiconductor memory device, determine whether or not a multi-bit error has occurred at a requested error of the semiconductor memory device, and process the request on the memory device instead of the semiconductor memory device when a multi-bit error has occurred.

The memory device may further store an address at which a single-bit error has occurred in the semiconductor memory device and data corresponding to the address, and the controller may control the memory device to check whether or not a single-bit error has occurred at the requested address during the request for the semiconductor memory device; process the request for the semiconductor memory device when a single-bit error has occurred at the requested address; and store multi-bit error occurrence information corresponding to the requested address in the memory device when a multi-bit error occurred in data outputted from the semiconductor memory device as a result obtained by processing the request for the semiconductor memory device.

The control device may process the request for the semiconductor memory device on the memory device when a single-bit error has occurred at the requested error.

The controller may control the memory device to update single-bit error occurrence information corresponding to the requested address when a single-bit error occurred in data outputted from the semiconductor memory device as a result obtained by processing the request for the semiconductor memory device.

In an embodiment, a method of determining whether a multi-bit error or a single-bit error has occurred in a semiconductor device may include: receiving a request for a first memory device by a controller; determining by the controller if the multi-bit error or the single-bit error has occurred at a requested address of the first memory device; and processing by the controller the request on a second memory device if the multi-bit error has occurred.

The method may further include: processing by the controller the request for the first memory device when the single-bit error has occurred; and registering by the controller multi-bit error occurrence information corresponding to the requested address when a multi-bit error exists in data outputted from the first memory device after the request for the first memory device is processed.

The method may further include processing by the controller the request for the first memory device on the second memory device when the single-bit error has occurred.

The request may include any one of a read request and a write request.

The method may further include update the single-bit error occurrence information corresponding to the requested address when single-bit error exists in data outputted from the first memory device after the request for the first memory device is processed.

The method may further include correcting the single-bit error of the data outputted from the first memory device.

The method may further include processing the request for the first memory device when none of a single-bit error or the multi-bit error has occurred at the requested address of the first memory device; and registering by the controller single-bit error occurrence information corresponding to the requested address when a single-bit error exists in data outputted from the first memory device.

The method may further include reporting a multi-bit error when the multi-bit error exists in the data outputted from the first memory device.

The multi-bit error occurrence information may be stored in the second memory device.

The single-bit error occurrence information may be stored in the second memory device.

The method may further include removing soft error information of the single-bit error occurrence information in the second memory device.

The removing of the soft error information may be performed at each predetermined period.

The removing of the soft error information may include primarily selecting addresses at which a single-bit error occurred K or less times (K is a natural number) in the second memory device; performing L read requests (L is a natural number) for the first memory device at the primarily-selected addresses; secondarily selecting addresses at which a single-bit error occurred M or less times (M is a natural number less than K+L) in the second memory device; and deleting the secondarily-selected addresses and single-bit error occurrence information corresponding to the secondarily-selected addresses. In an embodiment of the present invention, a semiconductor device may include: a controller configured to receive a request from a semiconductor memory device; determine whether a single-bit error or a multi-bit error has occurred at a requested address of the semiconductor memory device, and process the request in the semiconductor memory device if the single bit error has occurred or in an error register if the multi-bit error has occurred.

The controller may control an ECC block to correct the single-bit error contained in data from the semiconductor memory device.

The controller may be configured to register multi-bit error occurrence information when multi-bit error exits in data outputted from the semiconductor memory device.

In an embodiment of the present invention, a memory system may include: a memory controller; and a first memory device including a semiconductor device comprising: a controller configured to receive a request for the first memory device, determine whether or not a multi-bit error has occurred at a requested address of the first memory device, and process the request on a second memory device, when the multi-bit error has occurred.

In an embodiment of the present invention, an electronic device may include a first memory device, a central processing unit, and a memory controller including a semiconductor device, wherein the semiconductor device may comprise: a controller configured to receive a request for the first memory device, determine whether or not a multi-bit error has occurred at a requested address of the first memory device, and process the request on a second memory device, when the multi-bit error has occurred.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
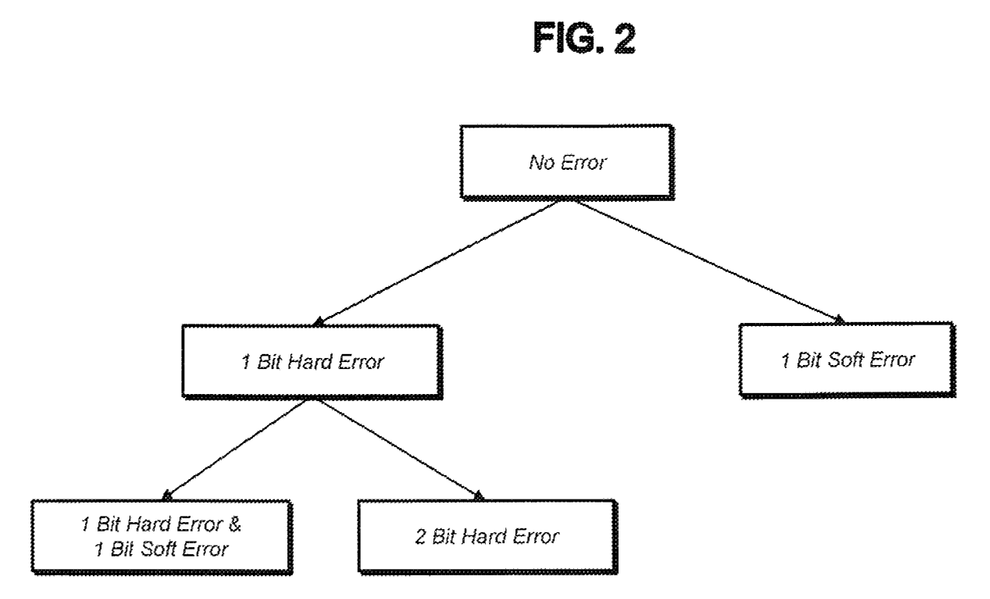
FIG. 2 is a block diagram illustrating the types of errors managed by a semiconductor device in accordance with an embodiment of the present invention.

FIG. 2 is a block diagram illustrating the types of errors managed by a semiconductor device in accordance with an embodiment of the present invention.

The probability that a multi-bit error will occur at a time at an arbitrary address of a semiconductor memory device is almost close to zero. Therefore, it may safely be said that a multi-bit error may generally develop from a single-bit error.

A soft error may indicate an error that temporarily occurs and soon disappears, and a hard error or stuck-at fault error may indicate an error that steadily occurs at a specific position due to damage of a cell.

Typically, since a single-bit soft error temporarily occurs and soon disappears, the single-bit soft error may not cause a serious problem. However, a single-bit hard error is continuously maintained, and may be expanded to a two or more-bit error when another single-bit error occurs.

Therefore, the semiconductor device in accordance with the embodiment of the present invention manages a multi-bit error developing from a single-bit error, or particularly, a single-bit hard error, wherein the semiconductor device relieves the multi-bit error.

Figure 3:
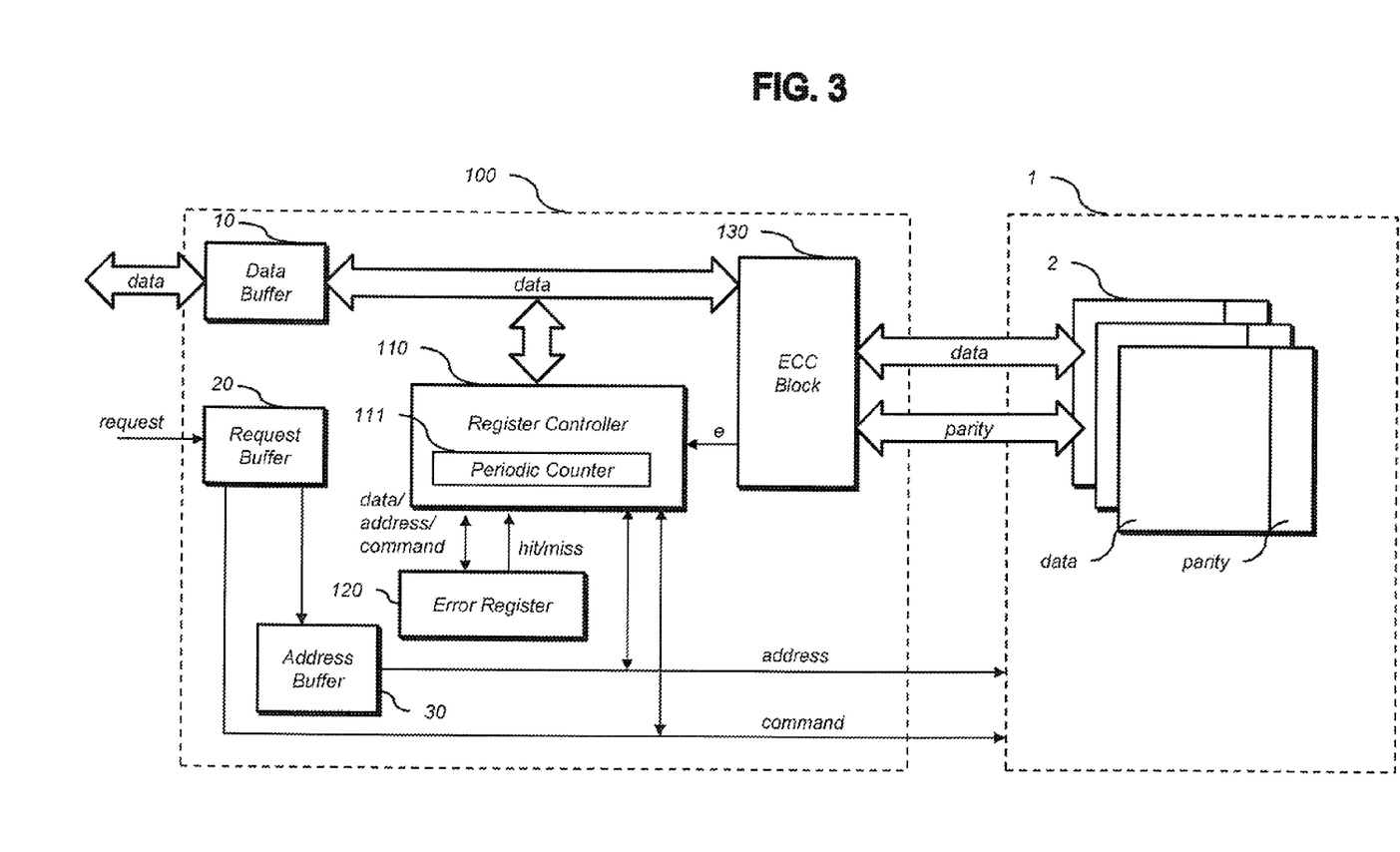
FIG. 3 is a block diagram of a semiconductor device in accordance with an embodiment of the present invention.

FIG. 3 illustrates an embodiment of the present invention.

FIG. 3 is a block diagram of a semiconductor device 100 in accordance with an embodiment of the present invention.

FIG. 3 illustrates that the semiconductor device 100 in accordance with the embodiment of the present invention may exist outside a semiconductor memory device 1, which may also be referred to hereinafter in the various embodiments of present invention as a first memory device. The semiconductor memory device 1 may be configured to store data information and parity information together; and provide the stored data information and parity information to the outside, and is not limited to a specific kind of semiconductor memory device.

For example, the semiconductor memory device 1 may serve as a volatile memory device such as DRAM or a non-volatile memory device such as MRAM, STT-MRAM, PCRAM, ReRAM, or FeRAM.

When the semiconductor device 100 in accordance with the embodiment of the present invention is positioned outside the semiconductor memory device 1 as illustrated in FIG. 3, the semiconductor device 100 may be included in a memory controller, a CPU, or the like. In an embodiment, the semiconductor device 100 may be separately provided outside a memory controller, a CPU or the like.

The semiconductor device 100 in accordance with the embodiment of the present invention may include a register controller 110, an error register 120, and an ECC block 130. The semiconductor device 100 in accordance with the embodiment of the present invention may further include a data buffer 10, a request buffer 20, and an address buffer 30.

The data buffer 10 may be configured to temporarily store data to write into the memory cell array 2 or temporarily store data read from the memory cell array 2; the request buffer 20 may be configured to temporarily store a command among external requests; and the address buffer 30 may be configured to temporarily store an address among external requests.

The ECC block 130 may be configured to distinguish the type of an error occurring in data read from the memory cell array 2 (for example, a single-bit error or a multi-bit error) by referring to parity information stored with the data in the memory cell array 2, and performing a function of correcting the error when the error can be corrected. In general, a multi-bit error cannot be corrected by the ECC block 130. The ECC block 130 may provide information e on the error to the register controller 110.

The register controller 110 may be configured to control the semiconductor memory device 1 and/or the error register 120 in response to an external request (for example, a read request or write request) by referring to the error register 120.

The register controller 110 may check whether or not information corresponding to a requested address exists in the error register 120. The error register 120 may provide information hit/miss on whether or not the information corresponding to the requested address exists, to the register controller 110.

The register controller 110 may process an external request on the error register 120, instead of the semiconductor memory device 1. Further, in the various embodiments of the present invention, the semiconductor memory device 1 may constitute a first memory device. In addition, the error register 120 may perform as a second memory device that may be configured within the semiconductor device 100. For this operation, the register controller 110 may provide an address/data/command signal to the error register 120 and receive data from the error register 120.

The register controller 110 may include a periodic counter 111 configured to count a predetermined period. The register controller 110 may perform an operation of filtering a soft error in the error register 120 at a predetermined period according to the control of the periodic counter 111. In another embodiment, the periodic counter 111 may exist outside the register controller 110. In another embodiment, the periodic counter 111 may exist outside the semiconductor device 100.

The operation of the register controller 110 will be described in detail with reference to FIGS. 7 and 8.

Figure 6:
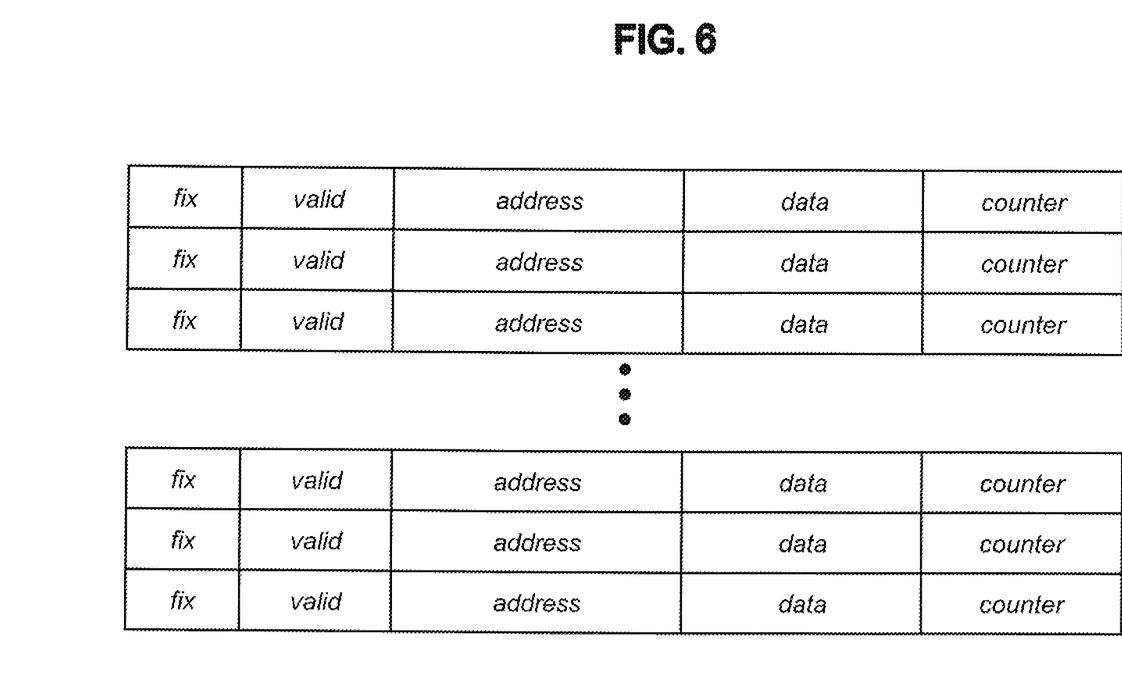
FIG. 6 illustrates the structure of an error register in accordance with the embodiment of the present invention.

FIG. 6 illustrates the structure of the error register 120 in accordance with the embodiment of the present invention. The error register 120 may include an address field and a data field. Furthermore, the error register may include a fix field, a valid field, and a counter field.

The address field may store address information, and an address stored in the address field may correspond to any one of addresses of the memory cell array 2. The data field stores data which is to be normally stored in a corresponding address of the memory cell array 2.

The fix field may store information indicating whether or not a multi-bit error occurred at a corresponding address of the semiconductor memory device 1. The activated fix field may indicate that the error register 120 replaces the semiconductor memory device 1 at the corresponding address.

The valid field and the counter field may indicate single-bit error occurrence information. The valid field may store information indicating whether or not a single or more-bit error occurred at a corresponding address of the error register 120. The counter field may store the number of single-bit errors occurring at the corresponding address of the semiconductor memory device 1.

Figure 4:
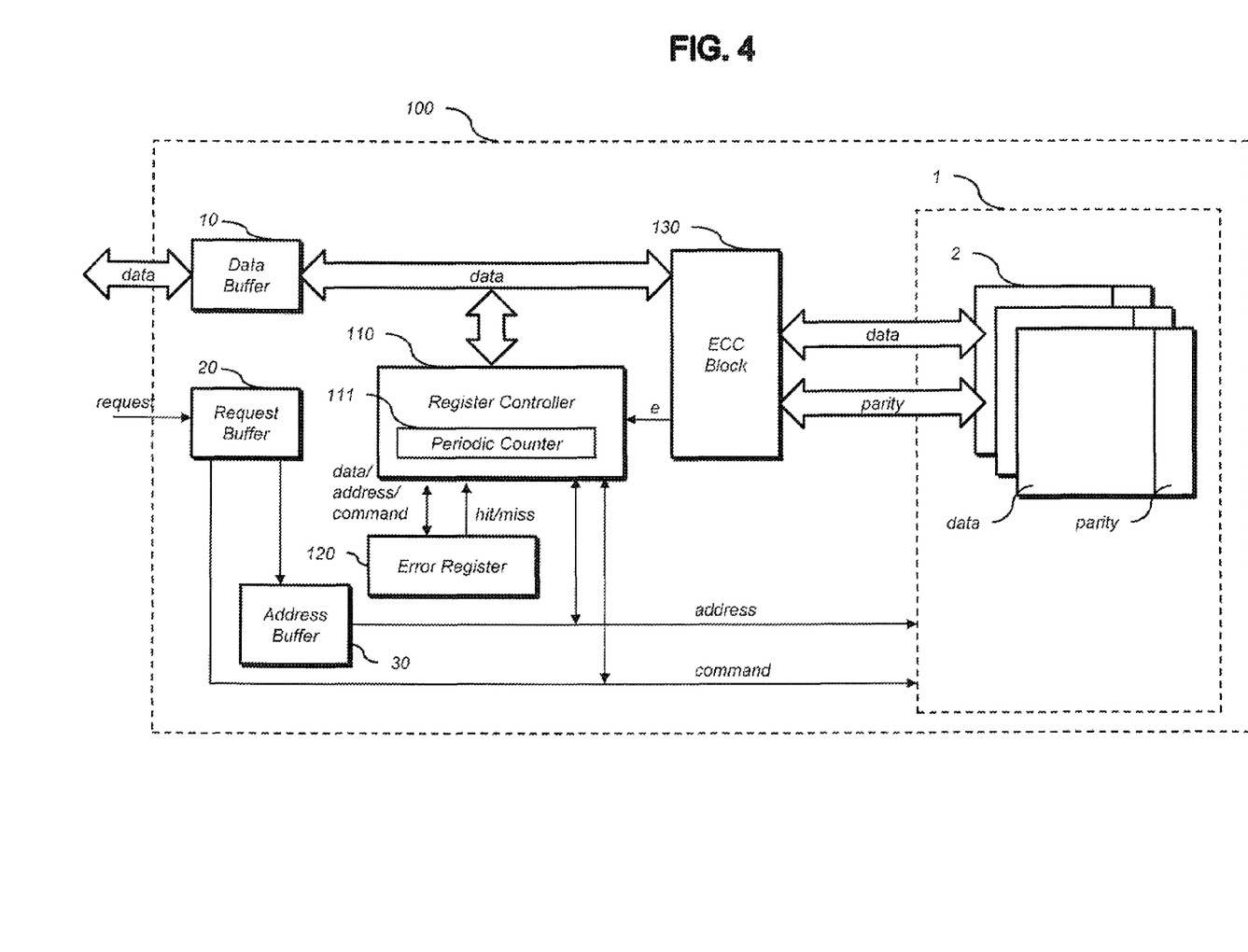
FIG. 4 is a block diagram of a semiconductor device in accordance with another embodiment of the present invention.

FIG. 4 illustrates an embodiment of the present invention.

FIG. 4 is a block diagram illustrating a semiconductor device 100 in accordance with an embodiment of the present invention.

The semiconductor device 100 in accordance with the embodiment of the present invention may include a semiconductor memory device 1 therein, or the semiconductor memory device internally configured within the semiconductor device 100. Therefore, the semiconductor device 1 in accordance with the embodiment of the present invention may be referred to as a semiconductor memory device. Except for this configuration, the components of the semiconductor device 100 in accordance with the embodiment of the present invention may have substantially the same connections and operations as those of the semiconductor device illustrated in FIG. 3. Therefore, the detailed descriptions thereof are omitted herein.

Figure 5:
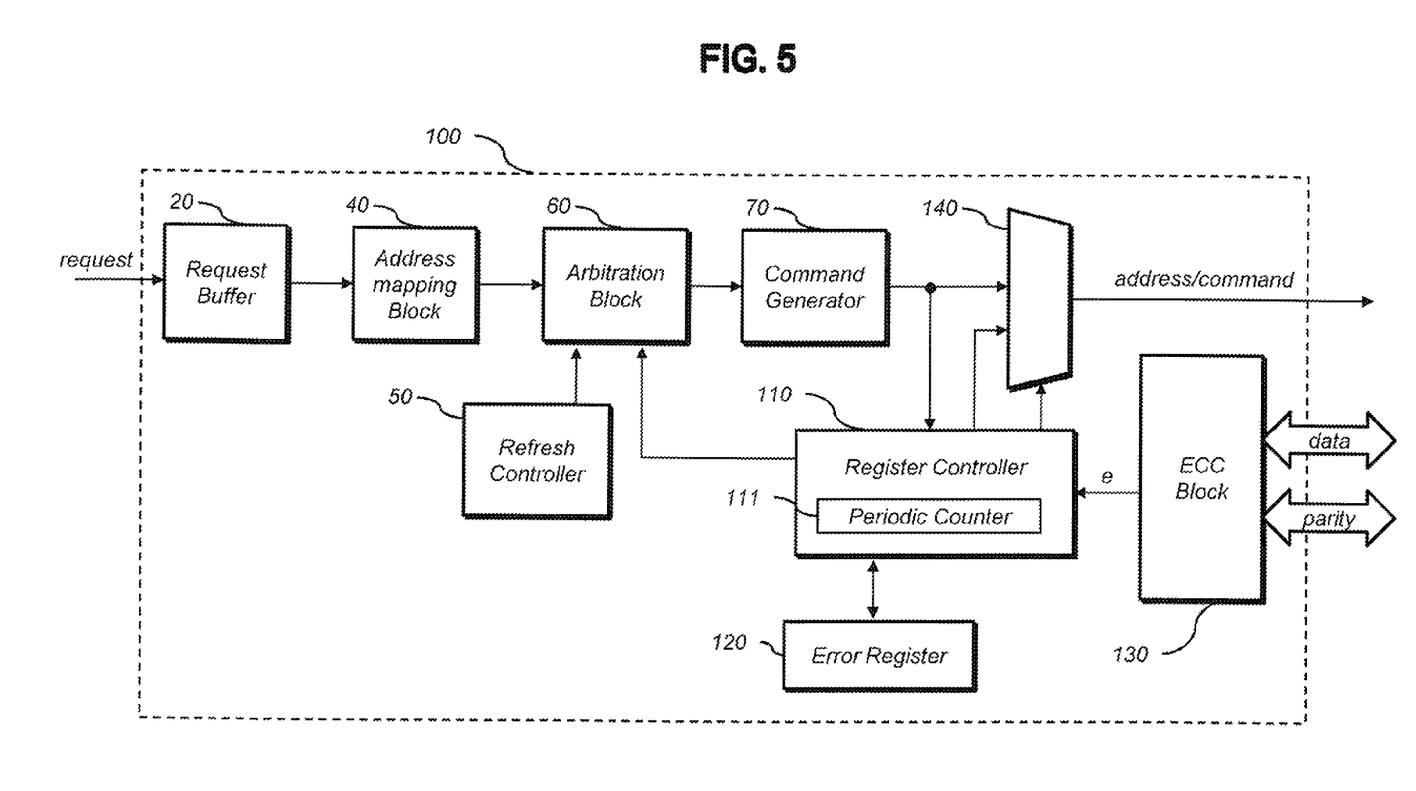
FIG. 5 is a block diagram of a semiconductor device in accordance with another embodiment of the present invention.

FIG. 5 illustrates an embodiment of the present invention.

FIG. 5 is a block diagram illustrating a semiconductor device 100 in accordance with another embodiment of the present invention. In FIG. 5, the semiconductor memory device 1 illustrated in FIG. 3 is omitted.

The semiconductor device 100 in accordance with the embodiment of the present invention may be considered as a controller to control the semiconductor memory device 1 in a system including the semiconductor memory device 1 and the controller. The controller may include a CPU, a memory controller or the like, but is not limited thereto.

The data paths, the semiconductor memory device 1, the data buffer 10, and the address buffer 30, which are illustrated in FIG. 3, are not illustrated in FIG. 5, but may be included while maintaining the same connections with components of FIG. 5 as illustrated in FIG. 3.

The semiconductor device 100 in accordance with the embodiment of the present invention may further include an address mapping block 40, an arbitration block 60, a command generator 70, a refresh controller 50, and an ECC block 130.

The address mapping block 40 may be configured to map an address contained in an external request to an address used in the semiconductor memory device 1. The arbitration block 60 may be configured to determine the processing sequence of a plurality of external requests. The command generator 70 may be configured to generate a command for controlling the semiconductor memory device 1 in response to an external request. The refresh controller 50 may be configured to control the arbitration block 60 to control a refresh operation of the semiconductor memory device 1. The ECC block 130 may be configured to determine whether or not an error occurred in data read from the semiconductor memory device, and correct the error if possible.

Furthermore, the semiconductor device 100 in accordance with an embodiment of the present invention may further include a register controller 110, a periodic counter 111, an error register 120, and a control selector 140. The ECC block 130 in accordance with the embodiment of the present invention may provide error information e of data read from a memory cell array to the register controller 110.

The register controller 110, the periodic counter 111 and the error register 120 may have the same configuration and function as described above. The register controller 110 may receive an address/command generated by the command generator 70. This address/command may correspond to an external request, and may be modified to control the semiconductor memory device. Since the technology for generating an address/command in response to an external request is well known, the detailed descriptions thereof are omitted herein.

The control selector 140 may be configured to select an address/command from the command generator 70 or the register controller 110 according to the control of the register controller 110, and provide the selected address/command to the semiconductor memory device.

The register controller 110 may deactivate the control selector 140 so as not to provide an address/command to the semiconductor memory device.

Although described below, when a requested address exists in an error register 120 and a multi-bit error occurs at the address, the register controller 110 may deactivate the control selector 140 to block access to the memory cell array 2 at the corresponding address. The register controller 110 may also process an external request (read request or write request) on the error register 120, thereby replacing the memory cell array 2.

During an operation of filtering a single-bit soft error, the register controller 110 may control the control selector 140 to provide an address/command generated by the register controller 110 to the semiconductor memory device 1. This operation may need to be performed prior to a general external request. For this operation, the register controller 110 may control the arbitration block 60 to postpone an operation of processing an external request.

In the case of a general request that does not need to be managed by the register controller 110, the register controller 110 may control the control selector 140 to provide an address/command transmitted from the command generator 70 to the semiconductor memory device.

Hereinafter, referring to FIGS. 7 and 8, the operation of the register controller 110 will be described in detail.

Figure 7:
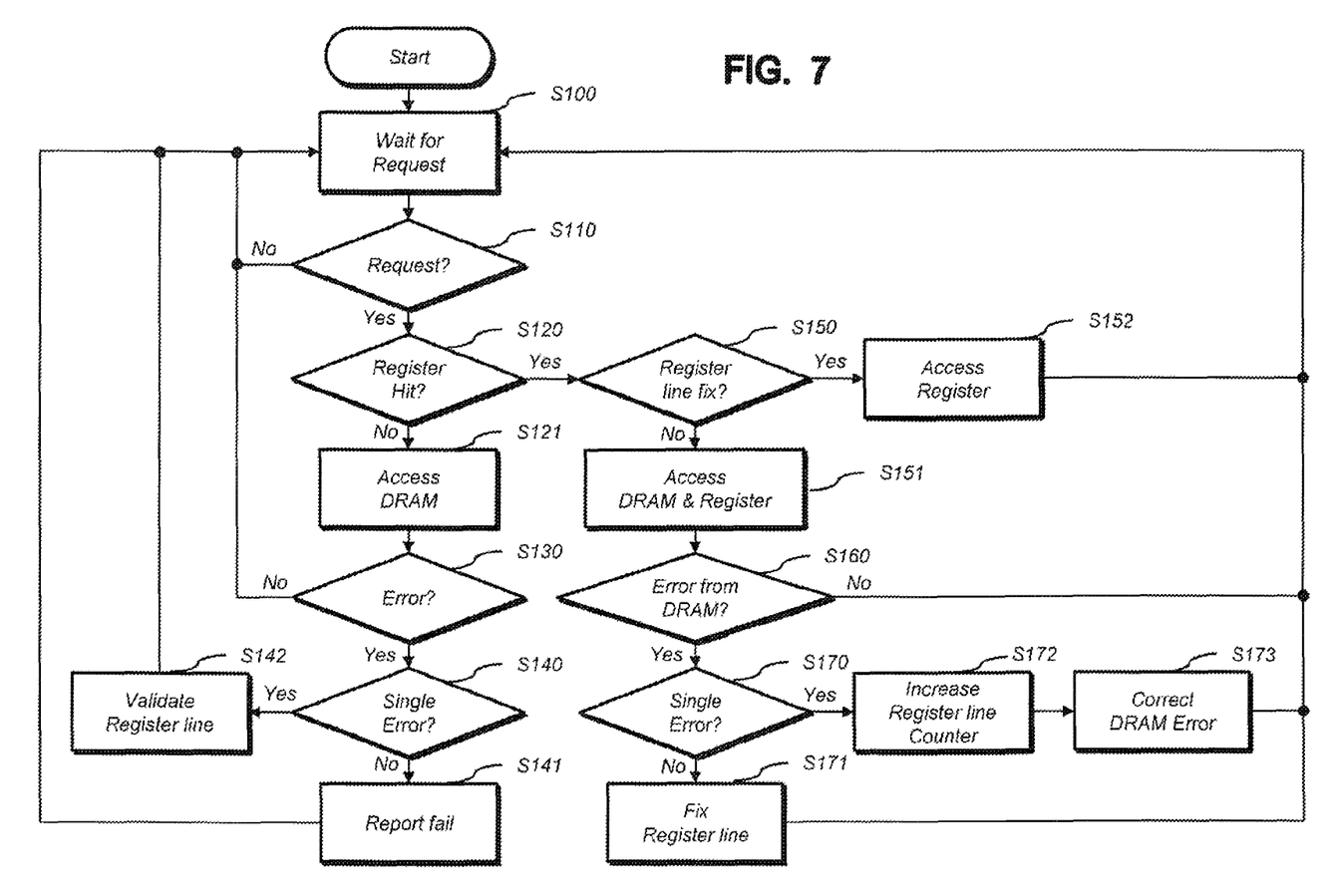
FIG. 7 is a flowchart illustrating an error management operation of a register controller in accordance with the embodiment of the present invention.

FIG. 7 illustrates an embodiment of the present invention.

FIG. 7 is a flowchart illustrating an operating method of the semiconductor device in accordance with the embodiment of the present invention. In particular, FIG. 7 illustrates a method for controlling management for a multi-bit error developing from a single-bit error. Since an operation of detecting an error is performed on data outputted from the memory cell array 2, the flowchart of FIG. 7 may be based on a read request, when the type of a request is not specified.

The control operation of FIG. 7 may be controlled by the register controller 110. During this operation, the register controller 110 may control the error register 120, the control selector 140, the arbitration block 60 and the like.

Initially, the register controller 110 waits for a request at step S100.

When a request is made at step S110, the register controller 110 may determine whether or not a requested address exists in the address field of the error register 120, at step S120.

When the requested address does not exist in the error register 120, the error controller 110 may process the request at a corresponding address of the memory cell array 2 at step S121. Then, the register controller 110 may determine whether or not an error occurred in data outputted from the memory cell array 2, based on error information e generated from the ECC block 130, at step S130.

When no error occurs, the register controller 110 may wait for a next request at step S100. When an error occurs, the register controller 110 may determine whether the error is a single-bit error or not by referring to the error information e, at step S140.

When a multi-bit error occurs at step 140, the error cannot be corrected by the ECC block 130. Therefore, the register controller 110 may report the error at step S141, and wait for a next request at step S100. As such, the probability that a multi-bit error will occur in a state where a single-bit error does not occur is very low as described above.

When a single-bit error occurs, the register controller 110 may store the requested address and data in the error register 120 and activate the value of the valid field. At this time, the stored data may be data of which the error is corrected by the ECC block 130. Furthermore, since a first error occurred at the corresponding address, the register controller 110 may set the value of the counter field to 1 at step S142. Then, the register controller 110 may wait for a next request at step S100.

When the requested address exists in the error register 120 at step S120, the register controller 110 may check whether a fix field corresponding to the requested field is activated or not, at step S150.

When the fix field is activated, that is, when a multi-bit error has occurred at the corresponding address before, the register controller 110 may control the error register 120 to process the request, instead of the semiconductor memory device 1, at step S152.

In this case, the semiconductor device 100 may process a read request and a write request on a corresponding data field within the error register 120 of the semiconductor device.

At step 150, when the fix field is not activated, that is, when only a single-bit error has occurred at the corresponding address before, the register controller 110 may set a control path to have access to both of the semiconductor memory device 1 and the error register 120 at step S151. In this case, the semiconductor memory device 1 and the error register 120 may be sequentially accessed or simultaneously accessed.

The step S151 may be performed even when the external request is a write request. Through this operation, a data field may store the same data as the data of the memory cell array 2, when a corresponding valid field is activated in the register.

Then, the register controller 110 may determine whether or not an error occurred in data from the semiconductor memory device 1 by referring to error information e provided by the ECC block 130, at step S160.

If no error has occurred, the register controller 110 may wait for a next request at step S100.

If an error has occurred, the register controller 110 may determine whether or not a single-bit error occurred by referring to the error information e transmitted from the ECC block 130 at step S170.

When the error is not a single-bit error, it may be considered that a multi-bit error occurred. Therefore, the register controller 110 may activate a fix field of the error register 120 corresponding to the requested address at step S171. The data field of the error register 120 corresponding to the requested address may already store normal data through the steps S142 and S151.

When the error is a single-bit error, it may be considered that another signal-bit error occurred. Therefore, the register controller 110 may increase the value of a counter field of the error register 120 corresponding to the requested address, at step S172. Then, the register controller 110 may control the ECC block 130 to correct the data error of the semiconductor memory device 1 at step S173. Then, the register controller 110 may wait for the next request at step S100.

As described above, the present invention may manage a multi-bit error developing from a single-bit error.

FIG. 7 illustrates a state in which a single-bit error may not be determined to be a soft error or hard error, when the error register 120 has a single-bit error occurrence record. As describe above, the soft error is an error that temporarily occurs. Therefore, when even information on the soft error is registered in the error register 120, the capacity of the error register 120 may be increased.

Therefore, the information on soft errors included in the error register 110 may be deleted to reduce the size of the storage space of the error register 120.

Figure 8:
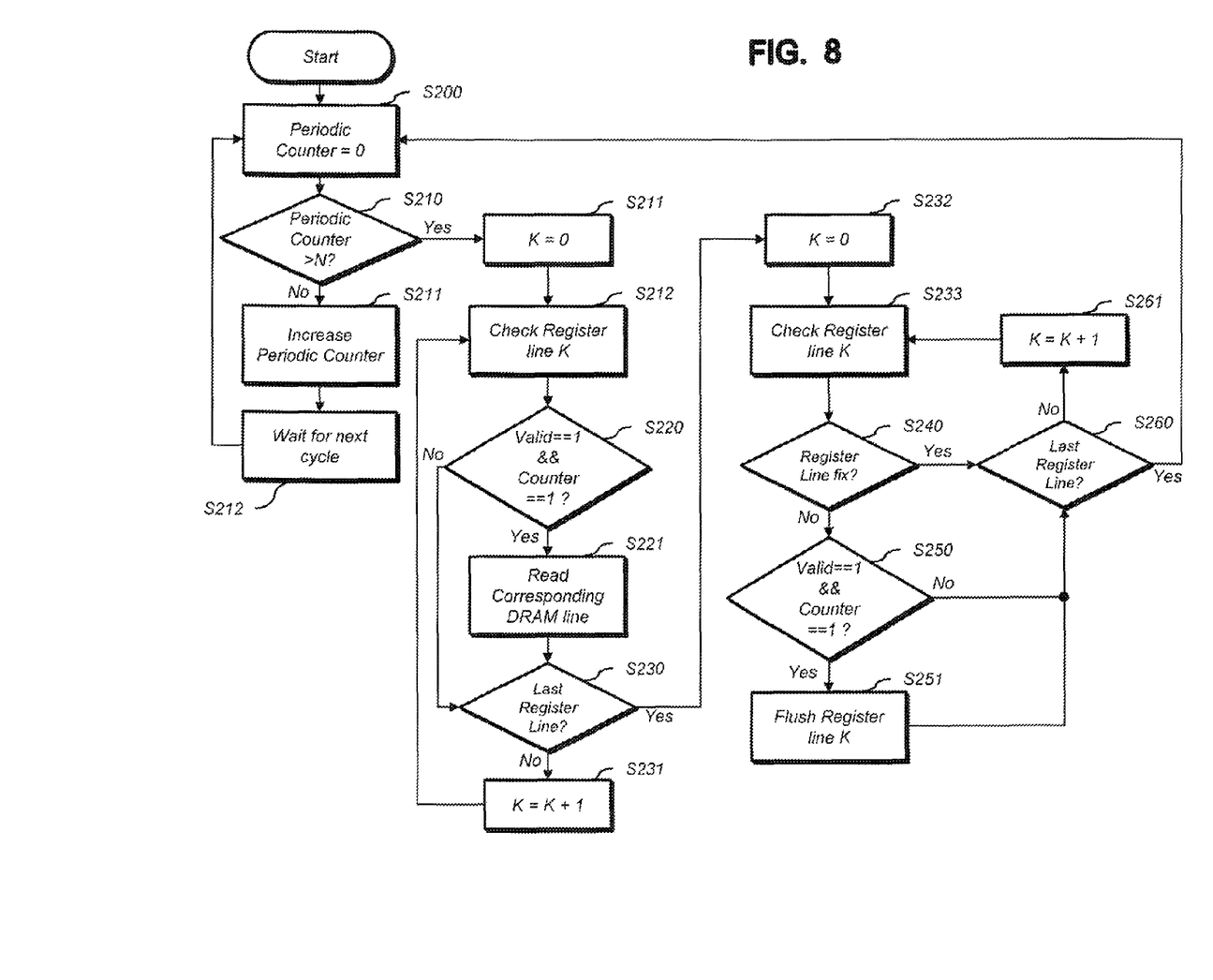
FIG. 8 is a flowchart illustrating an operation of removing a single-bit soft error in the error register of the semiconductor device in accordance with the embodiment of the present invention.

FIG. 8 illustrates an embodiment of the present invention.

FIG. 8 is a flowchart illustrating an operating method of the semiconductor device in accordance with an embodiment of the present invention. In particular, FIG. 8 illustrates an operation of removing a single-bit soft error in the error register 120 of the semiconductor device 100 in accordance with the embodiment of the present invention.

The semiconductor device 100 in accordance with the embodiment of the present invention may include the periodic counter 111 within the register controller 110. In another embodiment, the periodic counter 111 may be separately provided outside the register controller 110.

Steps S200 to S212 are to check the period of the periodic counter 111. In this embodiment of the present invention, the counting period of the periodic counter 111 may be set to N, and the register controller 110 may perform an operation of filtering a single-bit soft error once whenever the periodic counter 111 counts N.

The error register 110 may perform an operation of filtering a single-bit soft error at step S211.

Steps S211 to S231 are to primarily check all register lines of the error register 120.

At step S220, the register controller 110 may determine whether or not a valid field of a corresponding register line is 1, and a counter field of the corresponding register line is 1. When the valid field of the register line is 1 and the counter field of the register line is 1, it may indicate that a single or more-bit error occurred once at a corresponding address. The register line may become a candidate which may be determined to be a single-bit soft error.

For the candidate register line, the register controller 110 may generate a command to read the semiconductor memory device 1 at the corresponding address one more time, and provide the generated command to the semiconductor memory device 1. For this operation, the register controller 110 may control the control selector 140.

When an error occurs in data outputted from the semiconductor memory device 1, the error controller 110 may update the fix field and the counter field of the corresponding register line according to error information e provided from the ECC block 130. For example, as illustrated in FIG. 7, when a multi-bit error occurs, the error controller 110 may activate the fix field (refer to step S171), and when a single-bit error occurred, the error controller 110 may increase the counter field by 1 (refer to step S172).

When no error occurs, an error having occurred at the corresponding address may be determined to be a single-bit soft error at the following steps, and the corresponding register information may be removed at the following steps.

Referring to FIG. 8, steps S232 to S261 are to filter a single-bit soft error. The register controller 110 may sequentially check all lines of the error register 120 from the beginning.

When a fix field of a corresponding line is activated, it may indicate that a multi-bit error already occurred. Therefore, as long as the corresponding line is not the last line, the next line may be checked (steps S240, S260, and S261).

When a valid field of the corresponding line is 1 and a counter field of the corresponding line is 1, it may indicate that a single-bit error occurred once but no error occurred when a read request was performed again. In this case, the single-bit error may be determined to be a single-bit soft error. Therefore, the corresponding line may be removed from the error register 120 (steps S250 and S251).

When the last register line is completely checked, the error register 120 may delete all register lines of which the valid field is 1 and the counter field is 1, that is, all register lines indicating a single-bit soft error.

Then, the register controller 110 may reset the value of the periodic counter 111, restart counting, and wait for the next period (steps S200 to S212).

At steps S220 and 240 of FIG. 8, a single-bit soft error may be determined based on a case in which the valid field is 1 and the counter field is 1. In other embodiments, however, a single-bit soft error may be determined based on another reference value. Furthermore, a corresponding memory cell array was read once at step S221. In other embodiments, however, the corresponding memory cell array may be read a plurality of times.

For example, at step S220, the determination may be based on a case in which the valid field is 1 and the counter field is K (K is a natural number). Furthermore, the memory cell array 2 may be read L times (L is a natural number) at step S221. In this case, when the valid field is 1 and the counter field is M (M is a natural number less than K+N) at step S250, the error may be determined to be a single-bit soft error.

The reference value for filtering a single-bit soft error may be set in various manners. Therefore, in another embodiment, a single-bit soft error may be filtered according to a different method from the above-described method.

Figure 9:
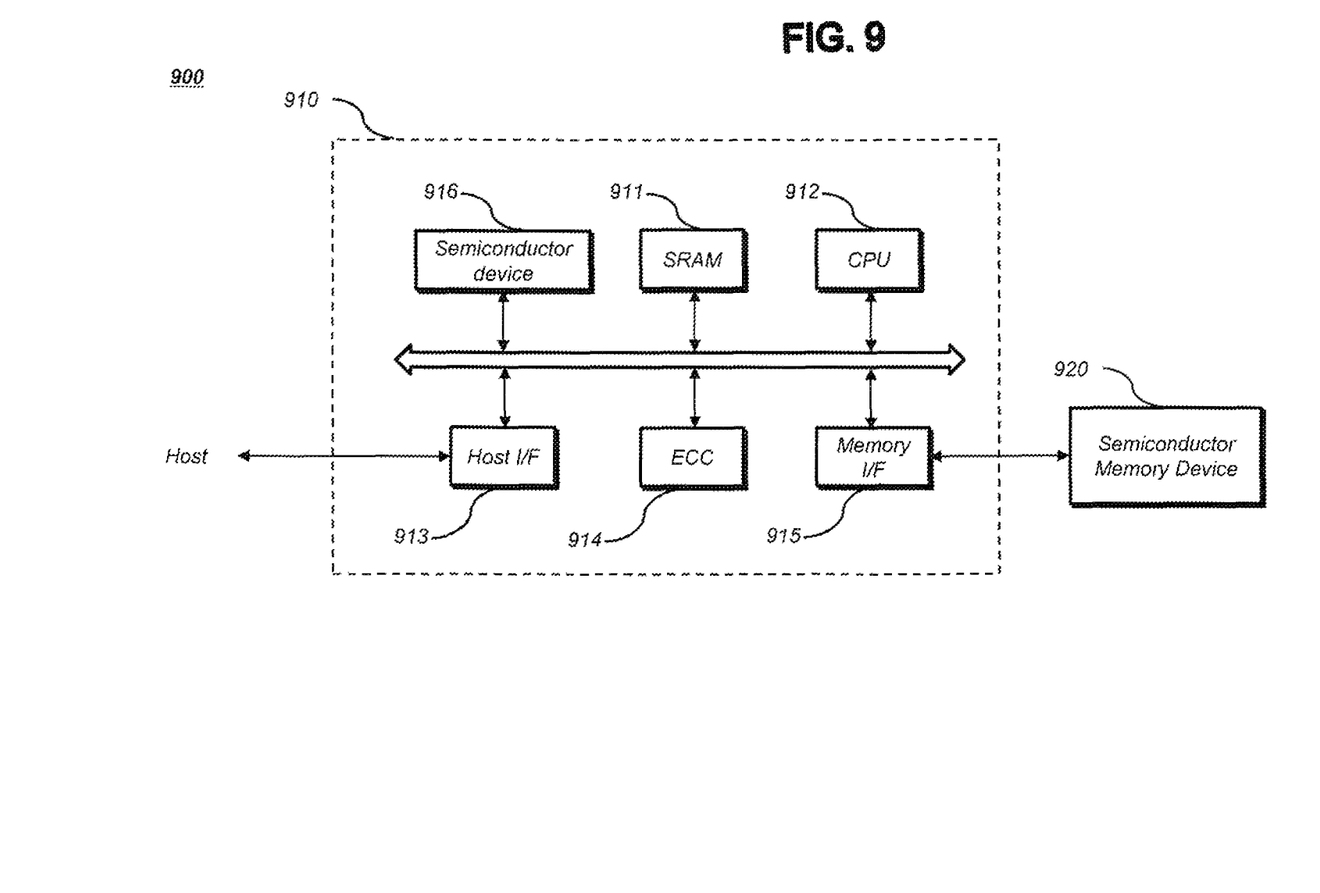
FIG. 9 is a view illustrating a memory system according to an embodiment of the present invention.

FIG. 9 is a block diagram illustrating a memory system according to an embodiment of the present invention.

In FIG. 9, the memory system 900 of the present embodiment may include a semiconductor device 916, a semiconductor memory device 920, a memory controller 910, and a CPU 912.

The semiconductor device 916 may be positioned outside of the semiconductor memory device 920. In addition, the semiconductor device 916 may be included in the memory controller 910 or the CPU 912. In these embodiments, the semiconductor device 916 may be configured within the memory controller 910. The semiconductor memory device 920 may serve as a volatile memory device such as DRAM or a nonvolatile memory device such as MRAM, STT-MRAM, PCRAM, ReRAM, or FeRAM. The semiconductor memory device 920 may be a multi-chip package having flash memory chips.

The memory controller 910 may control the semiconductor memory device 920, and may include an SRAM 911, a host interface 913, an ECC 914, and a memory interface 915. The SRAM 911 may be used as an operation memory of the CPU 912, the CPU 912 may perform control operation for data exchange of the memory controller 910, and the host interface 913 may have data exchange protocol of a host accessed to the memory system 900. The ECC 914 may detect and correct error of data read from the semiconductor memory device 920, and the memory interface 915 may interface with the semiconductor memory device 920. The memory controller 910 may include further ROM for storing data for interfacing with the host, etc.

The memory system 900 may be used as a memory card or a solid state disk SSD by combination of the semiconductor memory device 920 and the memory controller 910. In the event that the memory system 900 is the SSD, the memory controller 910 may communicate with an external device, e.g. host through one of various interface protocols such as USB, MMC, PCI-E, SATA, PATA, SCSI, ESDI, IDE, etc.

Figure 10:
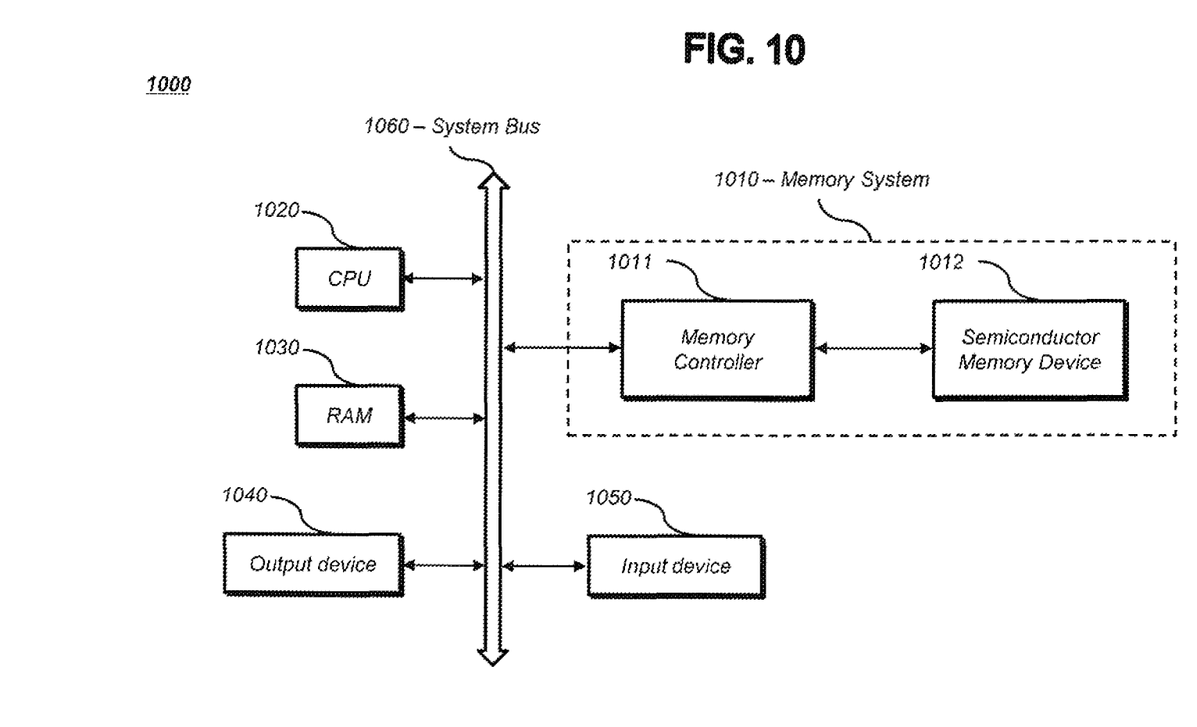
FIG. 10 is a view illustrating a computing system according to an embodiment of the present invention.

FIG. 10 is a view illustrating an electronic device or a computing system according to an embodiment of the present invention.

In FIG. 10, the computing system 1000 of the present embodiments may include a CPU 1020 connected electrically to a system bus 1060, a RAM 1030, a user interface 1040, an input device 1050, and a memory system 1010 including a memory controller 1011 and a nonvolatile memory 1012. In case that the computing system 1000 is a mobile device, a battery (not shown) for supplying an operation voltage to the computing system 1000 may be further provided. The computing system 1000 of the present invention may further include an application chipset, a CMOS image processor CIS, a mobile DRAM, etc.

The output device or user interface 1040 may be a self-contained display in the case of a portable electronic device. The input device or modem 1050 may be a physical keyboard or a virtual keyboard in the case of a portable electronic device, and may further include, without limitation, a trackball, touchpad, or other cursor control device combined with a selection control, such as a pushbutton, to select an item highlighted by cursor manipulation. The memory system 1010 may include a semiconductor memory device as described in FIG. 9.

In accordance with the embodiments of the present invention, the semiconductor device may relieve a multi-bit error occurring in the semiconductor memory device so as to guarantee the data reliability of the semiconductor memory device. Furthermore, the semiconductor device may relieve a multi-bit error developing from a soft error so as to guarantee the data reliability of the semiconductor memory device.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a controller configured to receive a request for a first memory device, determine whether or not a multi-bit error has occurred at a requested address of the first memory device, and process the request on a second memory device instead of the first memory device, when the multi-bit error has occurred,
   wherein the second memory device is configured to store an error address where the multi-bit error occurred at the first memory device prior to receiving the request and a normal data corresponding to the error address,
   wherein the controller processes the request for the first memory device when a single-bit error has occurred at the requested address of the first memory device, and registers multi-bit error occurrence information corresponding to the request address when a multi-bit error exists in data outputted from the first memory device, and
   wherein the second memory device is configured to store single-bit error occurrence information, and the controller removes soft error information in the single-bit error occurrence information stored in the second memory device.

2. The semiconductor device of claim 1, wherein the controller controls the second memory device to perform the request for the first memory device on the second memory device, when the single-bit error has occurred.

3. The semiconductor device of claim 2, wherein the request comprises any one of a write request and a read request.

4. The semiconductor device of claim 1, wherein when a single-bit error exists in data outputted from the first memory device as a result obtained by processing the request for the first memory device, the controller controls the second memory device to update single-bit error occurrence information corresponding to the requested address in the second memory device.

5. The semiconductor device of claim 4, wherein the controller controls an ECC block to correct the single-bit error contained in the data from the first memory device.

6. The semiconductor device of claim 5, further comprising the ECC block.

7. The semiconductor device of claim 1, wherein the controller controls the first memory device to process the request when none of a single-bit error and the multi-bit error has occurred at the requested address of the first memory device, and registers single-bit error occurrence information corresponding to the requested address when a single-bit error exists in data outputted from the first memory device as a processing result.

8. The semiconductor device of claim 7, wherein when a multi-bit error exists in the data from the first memory device, the controller reports the error.

9. The semiconductor device of claim 1, wherein the multi-bit error occurrence information is stored in the second memory device.

10. The semiconductor device of claim 1, wherein the controller removes the soft error information at each predetermined period.

11. The semiconductor device of claim 1, wherein the controller primarily selects addresses at which a single-bit error occurred K or less times (K is a natural number) in the second memory device, controls the first memory device to perform L read requests (L is a natural number) at the primarily-selected addresses, secondarily selects addresses at which a single-bit error occurred M or less times (M is a natural number less than K+L) in the second memory device, and controls the second memory device to delete the secondarily-selected addresses and single-bit error occurrence information corresponding to the secondarily-selected addresses, in order to remove the soft error information.

12. The semiconductor device of claim 1, further comprising the second memory device.

13. The semiconductor device of claim 1, wherein further comprising:
a command generator configured to generate a control command for controlling the first memory device in response to the request; and
a control selector configured to provide any one of the control command generated by the command generator and a control command generated by the controller to process the request for the first memory device, to the first memory device according to selection of the controller.

14. The semiconductor device of claim 13, further comprising an arbitration block configured to determine the processing sequence of a plurality of requests,
wherein the controller temporarily stops the operation of the arbitration block when the controller is intended to directly control the first memory device.

15. A system comprising a control device configured to control a semiconductor memory device,
wherein the control device comprises:
a register configured to store an error address at which a multi-bit error has occurred in the semiconductor memory device and a normal data corresponding to the error address; and
a controller configured to receive a request for the semiconductor memory device, determine whether or not a multi-bit error has occurred at a requested address of the semiconductor memory device, and process the request on the register instead of the semiconductor memory device when a multi-bit error has occurred,
wherein the register is configured to store the error address and the normal data prior to receiving the request, the register further stores single-bit error occurrence information indicating an address at which a single-bit error has occurred in the semiconductor memory device and data corresponding to the address,
wherein the controller controls the register to check whether or not a single-bit error has occurred at the requested address during the request for the semiconductor memory device, processes the request for the semiconductor memory device when a single-bit error has occurred at the requested address, and stores multi-bit error occurrence information corresponding to the requested address in the register when a multi-bit error occurred in data outputted from the semiconductor memory device as a result obtained by processing the request for the semiconductor memory device, and
wherein the controller removes soft error information in the single-bit error occurrence information stored in the register.

16. The system of claim 15, wherein the control device processes the request for the semiconductor memory device on the register when a single-bit error has occurred at the requested error.

17. The system of claim 16, wherein the request comprises any one of a read request and a write request.

18. The system of claim 16, wherein the controller further comprises an ECC block configured to correct the single-bit error contained in the data outputted from the semiconductor memory device.

19. The system of claim 15, wherein the controller controls the register to update single-bit error occurrence information corresponding to the requested address when a single-bit error occurred in data outputted from the semiconductor memory device as a result obtained by processing the request for the semiconductor memory device.

20. The system of claim 15, wherein the controller controls the semiconductor memory device to process the request when none of a single-bit error and the multi-bit error has occurred at the requested address of the semiconductor memory device, and controls the register to register single-bit error occurrence information corresponding to the requested address in the register when a single-bit error exists in the data from the semiconductor memory device as the processing result.

21. The system of claim 15, wherein the controller removes the soft error information at each predetermined period.

22. The system of claim 15, wherein the controller primarily selects addresses at which a single-bit error occurred K or less times (K is a natural number) in the register, controls the semiconductor memory device to perform L read requests (L is a natural number) at the primarily-selected addresses, secondarily selects addresses at which a single-bit error occurred M or less times (M is a natural number less than K+L) in the register, and controls the register to delete the secondarily-selected addresses and single-bit error occurrence information corresponding to the secondarily-selected addresses, in order to remove the soft error information.

23. The system of claim 15, wherein the controller comprises:
a command generator configured to generate a control command for controlling the semiconductor memory device in response to the request; and
a control selector configured to provides any one of the control command from the command generator and a control command generated by the controller to process the request for the semiconductor memory device to the semiconductor memory device according to selection of the controller.

24. The system of claim 15, wherein the controller further comprises an arbitration block configured to determine the processing sequence of a plurality of requests, and the controller temporarily stops the operation of the arbitration block when the controller is intended to directly control the semiconductor memory device.

* * * * *